United States Patent [19]

Coleman

[11] Patent Number: 4,672,305

[45] Date of Patent: Jun. 9, 1987

[54] STORM WARNING METHOD AND APPARATUS

[75] Inventor: Ernest W. Coleman, Phoenix, Ariz.

[73] Assignee: Ernco Industries, Inc., Cherry Hill, N.J.

[21] Appl. No.: 681,548

[22] Filed: Dec. 14, 1984

Related U.S. Application Data

[63] Continuation-in-part of Ser. No. 516,288, Jul. 22, 1983, Pat. No. 4,506,211, which is a continuation of Ser. No. 235,168, Feb. 17, 1981, Pat. No. 4,422,037.

[51] Int. Cl.$^4$ ............................................ G01N 31/02
[52] U.S. Cl. ................................. 324/72; 324/77 R
[58] Field of Search ...................... 324/72, 335, 77 R

[56] References Cited

U.S. PATENT DOCUMENTS

| | | | |
|---|---|---|---|
| 3,715,660 | 2/1973 | Ruhnke | 324/72 |
| 4,023,408 | 5/1977 | Ryan et al. | 324/72 |
| 4,115,732 | 9/1978 | Krider et al. | 324/72 |
| 4,156,182 | 5/1979 | Brick et al. | 324/72 |
| 4,198,599 | 4/1980 | Krider et al. | 324/72 |
| 4,245,190 | 1/1981 | Krider et al. | 324/72 |
| 4,383,260 | 5/1983 | Ryan | 343/701 |
| 4,395,906 | 8/1983 | Ryan et al. | 73/170 R |
| 4,422,037 | 12/1983 | Coleman | 324/72 |
| 4,506,211 | 3/1985 | Coleman | 324/72 |

OTHER PUBLICATIONS

Bowe, "The Waveforms of Atmospherics and the Propagation of Very Low Frequency Radio Waves", Philosphical Mag., vol. 42, No. 325, Feb. 1951, pp. 121-138.
Wormel, "Lightning", Quarterly Journal of the Royal Meteor Soc., vol. 79, 1953, pp. 474-489.
Hepburn, "Atmospherics with Very Low-Frequency Components", Nature (London), vol. 171, pp. 837-838, May 1953.
Ruhnke, "Distance to Lightning Strokes As Determined from Electrostatic Field Strength Measurements", Jour. of Applied Met., vol. 1, No. 4, Dec. 1962.
Taylor, "Radiation Field Characteristics of Lightning Discharges in the Band 1 kc/s to 100 kc/s", Jor. of Res. of the National Bureau of Stan, vol. 67D, No. 5, Sep. 1963.
Kohl, "A 500-khz Sferics Range Detector", Jor. of App. Meteor., vol. 8, pp. 610-617, Aug. 1969.
Baum, "Sensors for Electromagnetic Pulse Measurements both Inside and Away from Nuclear Source Regions", IEEE Trans. E.M.C., vol. EMC-20, No. 1, pp. 22-35, Feb. 1978.
Weidman et al, "The Radiation Field Wave Forms Produced by Intracloud Lightning Discharge Process", Jour. of Geo. Res., vol. 84, No. C6, pp. 3159-3164, Jun. 1979.
Weidman et al, "Lightning Amplitude Spectra in the Interval from 100 kHz to 20 MHz", Geo. Res. Letters, vol. 8, No. 8, pp. 931-934, Aug. 1981.
Uman, "A Review of Natural Lightning: Experimental Data and Modeling", IEEE Trans. on E.M.C., vol. EMC-24, No. 2, May 1982.
Beasley et al, "Electric Fields Preceding Cloud-to-Ground Lightning Flashes," Jour. of Geo. Res., vol. 87, No. C7, pp. 4883-4902, Jun. 1982.
Mazur, "Associated Lightning Discharges", Geo. Res. Letters, vol. 9, No. 11, pp. 1227-1230, Nov. 1982.
Taylor, "A VHF Technique for Space-Time Mapping of Lightning Discharge Process", Journal of Geophysical Research, vol. 83, No. C7, 7/20/78, pp. 3575-3583.

(List continued on next page.)

Primary Examiner—Reinhard J. Eisenzopf
Assistant Examiner—Robert W. Mueller
Attorney, Agent, or Firm—Benasutti and Murray

[57] ABSTRACT

Electric (E) and magnetic (H) field components of a lightning stroke are separately received in order to determine and display the location of regions of recently occuring lightning activity. Direction is determined by operating upon electrical signals associated with both the E and H field components. Range is determined by measuring the magnitude of the H field at two different frequencies. The range is then computed as a function of the ratio of the magnitude of the H field at a first frequency to the magnitude of the H field at a second frequency.

10 Claims, 9 Drawing Figures

OTHER PUBLICATIONS

Wong, et al, "The Inclination of Intracloud Lightning Discharges," Journal of Geophysical Research, vol. 83, No. C4, 4/20/78, pp. 1905-1912.

Krider et al, "Lightning Detection Systems for Fire Management", Fifth Joint Conference on Fire and Forest Meteorology, Mar. 14-16, 1978.

Weidman, et al, "Submicrosecond Risetimes in Lightning Radiation Fields," NASA Conference Publication 2128, FAA-RD-80-30, 5/22/80, pp. 29-38.

Baum et al, "In-Flight Evaluation of a Severe Weather Avoidance System for Aircraft," AFWAL-TR-80-3022, May 1980, pp. 55-57.

Rozelle, "An Alternative to Radar," The AOPA Pilot, 11/1979, pp. 96-104.

Baum, et al, "Measurement of Electromagnetic Properties of Lightning with 10 Nanosecond Resolution," NASA Conference Publication 2128 FAA-RD-80-30, Apr. 22, 1980, pp. 39-66.

Uman et al, "Magnetic Field of Lightning Return Stroke", Journal of Geophysical Research, vol. 74, No. 28, 12/20/69, pp. 6899-6909.

Ruhnke, "Determining Distance to Lightning Strokes from a Single Station: NOAA TR E RL 195-APCL 16, 1/1971, pp. 20-23.

Fisher et al, "Measured Electric Field Risetimes for First and Subsequent Lightning Return Strokes," Journal of Geophysical Research, vol. 77, No. 3, 1/20/72.

Uman et al, "Correlated Electric and Magnetic Fields from Lightning Return Strokes", Journal of Geophysical Research, vol. 80, No. 3, 1/20/75, pp. 373-376.

Brantley et al, "Lightning Properties in Florida Thunderstorms from Video Tape Records", Journal of Geophysical Research, vol. 80, No. 24, 8/20/75, pp. 3402-3406.

Krider, et al, "Broadband Antenna Systems for Lightning Magnetic Fields", Journal of Applied Meteorology, vol. 14, 3/75, pp. 252-255.

Krider et al, "A Gated, Wideband Magnetic Direction Finder for Lightning Return Strokes," Journal of Applied Meteorology, vol. 15, 3/76, pp. 301-306.

Herrman, et al, "Test of the Principle of Operation of a Wideband Magnetic Direction Finder for Lightning Return Strokes", Journal of Applied Meteorology, vol. 15, 4/76, pp. 402-405.

"Lightning Test Waveforms and Techniques for Aerospace Vehicles and Hardware", Report of SAE Committee AE-4 Special Task F, 5 May 1976, pp. 2-3.

Livingston, et al, "Electric Fields Produced by Florida Thunderstorms", vol. 83, No. C1, 1/20/78, pp. 385-401.

Krider et al, "The Electric Fields Produced by Lightning Stepped Leaders," vol. 82, No. 6, 2/20/77, pp. 951-960.

Leise et al, "A Transmission Line Model with General Velocities of Lightning," vol. 82, No. 3, 1/20/77, pp. 391-396.

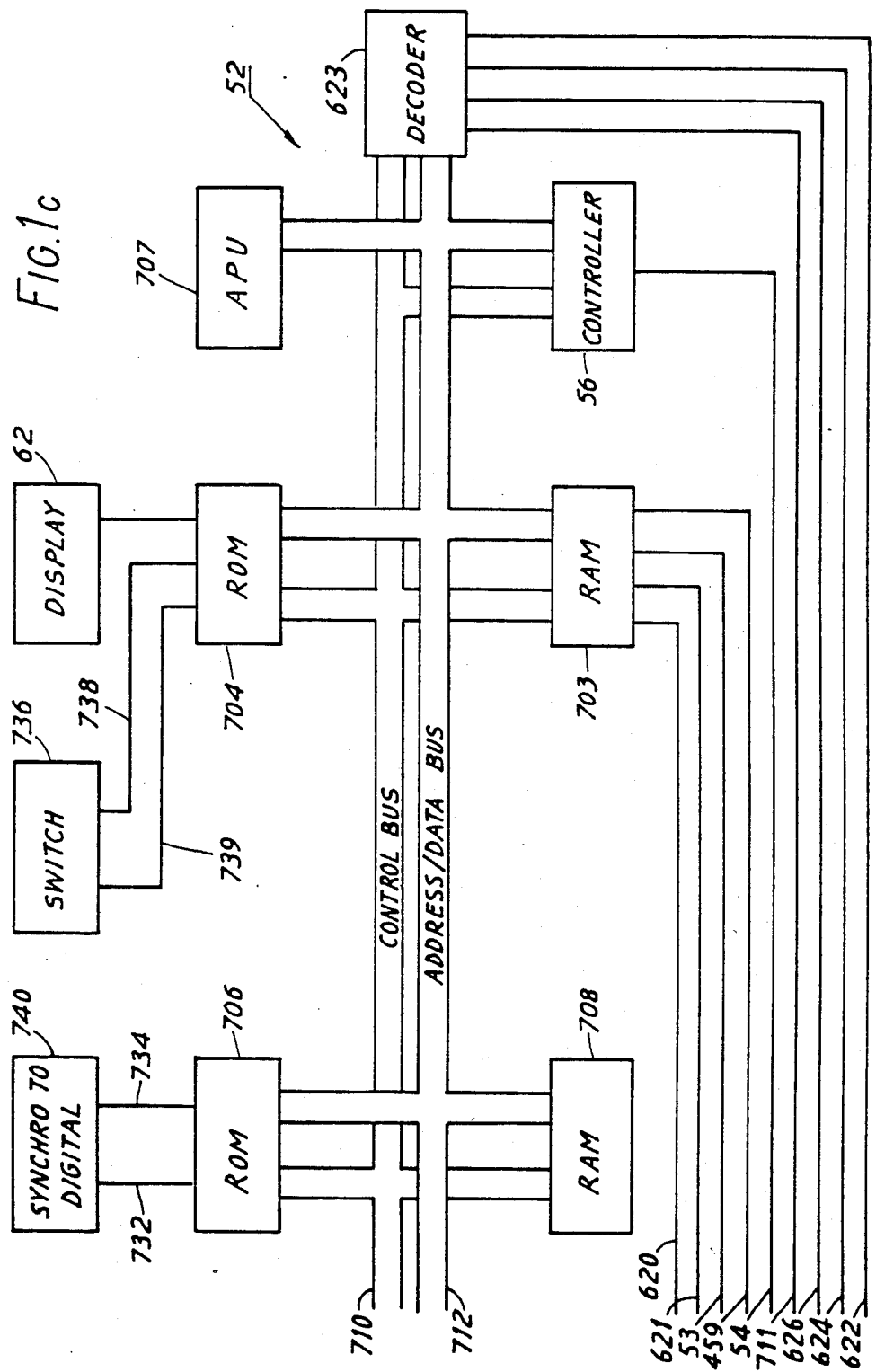

STORM WARNING METHOD AND APPARATUS

CROSS REFERENCE TO RELATED APPLICATIONS

This application is a continuation-in-part of co-pending U.S. patent application Ser. No. 516,288, filed July 22, 1983, now U.S. Pat. No. 4,506,211, issued Mar. 19, 1985, entitled "Storm Warning Method and Apparatus" of Ernest W. Coleman, which is a continuation of U.S. patent application Ser. No. 235,168, filed Feb. 17, 1981, now U.S. Pat. No. 4,422,037, issued Dec. 20, 1983, entitled "Storm Warning Method and Apparatus" of Ernest W. Coleman, both of which are incorporated by reference in the present application as if fully set forth herein.

BACKGROUND OF THE INVENTION

This invention relates to apparatus and methods for detecting regions of lightning activity and more particularly to an apparatus and method for determining and displaying azimuth and range information relating to the occurrence of lightning activity associated with thunderstorms.

Thunderstorms, characterized by turbulence and electrical activity (lightning), create great dangers, particularly to aircraft. It is therefore desirable to locate thunderstorms as accurately as possible so that they can be tracked and avoided. Lightning associated with mature stages of thunderstorms generates electrical signals that propagate through the atmosphere. The detection, recognition, measurement and analysis of these electrical signals provide a basis for storm tracking and avoidance.

Lightning flashes are composed of a series of high current lightning strokes, each stroke being preceded by a lower current discharge called a leader. The duration of electrical activity associated with a lightning stroke varies, but in many instances can last as long as 100 microseconds. The initial rise time of electrical signals associated with a lightning stroke almost never exceeds five microseconds. Following the first peak of the electrical signals of a lightning stroke, lesser signals of sub-microsecond duration, but with fast rise times (of five microseconds or less), will occur.

U.S. Pat. No. 4,422,037, which is the grandparent of the present application, discloses an improved apparatus and method of detecting, tracking and displaying lightning activity. In accordance with the method and apparatus disclosed therein, sensors are provided which measure the time rate of change of the magnetic and electric flux densities of the electrical signals generated by the lightning. The outputs of the sensors are integrated to provide a measure of electric (E) and magnetic (H) fields of the lightning signals. The total magnetic field value is calculated from sampled magnetic fields and the value is compared with a predetermined field strength to estimate in which of several range regions the lightning stroke occurred. The integrated magnetic field value is also compared to predetermined fields strengths to predict in which range region the lightning stroke occurred.

If the regions predicted by the two methods are adjacent regions or the same region, then the ratio of the integrated magnetic to electric field values are used to determine the range from a look up table. If the two regions predicted are the near and distant regions, then the ratio of the total magnetic to total electric field value is calculated from the sampled data and used to determine the range from the look up tables. Due to ambiguities present in the plot of the ratio of magnetic to electric fields, the maximum effective range of such airborne systems in accordance with the invention disclosed in the aforementioned patent is approximately fifty kilometers, at frequencies practical for use in airborne equipment. Lower frequencies could extend this maximum range somewhat, but would necessitate the use of larger sensors which are impractical for installation on smaller aircraft. Considering the high speeds of present day aircraft, this fifty kilometer limitation on range can be quite disadvantageous.

Accordingly, it is an object of the present invention to provide a method and apparatus for detecting and displaying regions of thunderstorm activity at ranges which are suitable for airborne applications.

It is another object of the present invention to provide a method and apparatus for detecting regions of thunderstorm activity which eliminate ranging ambiguity at ranges suitable for airborne applications.

It is yet another object of the present invention to provide a method and apparatus for extending the maximum effective range for detecting thunderstorm activity without increasing the size of sensing equipment.

SUMMARY OF THE INVENTION

The present invention comprises an apparatus and method for displaying the location of regions of recently occurring lightning activity. The apparatus includes receiving means for separately receiving the electric (E) and magnetic (H) field components of a lightning stroke. Processor means analyzes the lightning fields to determine both range and direction to the lightning activity. Range is determined by measuring the magnitude of the magnetic (H) field at two different frequencies. The range is then computed as a function of the ratio of the magnitude of the H field at a first frequency to the magnitude of the H field at a second frequency. In a preferred embodiment of this invention, the first frequency is lower than the second frequency. Display means shows the region of a thunderstorm by indicating the rate of lightning occurring in the region.

The receiving means includes a pair of cross-loop sensors and an electric field sensor. The outputs are suitably amplified and integrated to provide a measure of the E and H fields of the lightning signals.

The processor means includes threshold circuitry and slope detection circuitry connected to the receiving means for recognizing lightning signals received by the receiving means and discriminating against interfering signals and background noise. When the rise time and amplitude of the lightning signal component are above a predetermined minimum, first gating circuitry is triggered which provides a signal indicating that a bona fide lightning strike has occurred. At the peak amplitude of the lightning signal, a pulse width monitor circuit measures the time occurrence of the peak signal since the amplitude of the lightning signal was above a predetermined minimum threshold.

The processor means also includes the first or low frequency detection circuitry connected to the receiving means for separately detecting the lightning fields received by the receiving means at a frequency band centered at the predetermined first frequency. The output of the receiving means is also connected to the second or high frequency detection circuitry which, in response to peak control signals from the peak detector, separately samples the lightning fields at the predetermined second frequency. The fast rise time signals are held at the peak value by track and hold circuits and then converted by analog to digital converters and stored in a memory.

Upon the occurrence of a bona fide lightning strike, the peak detector connected to the first gating circuitry transmits a narrow pulse to the pulse width circuit, interrupter controller and the analog to digital converters. The interrupter controller is activated in response to the narrow pulse to interrupt the processor means after a predetermined time interval.

When the predetermined time interval is over, that is when the lightning activity ends, an interrupt signal from the interrupt controller is transmitted to a programmable processor which in turn reads the contents of the memory into its buffer memory. At the same time the processor also reads the low frequency field values for the predetermined interval through a multiplexer and the memory circuitry. The higgh frequency sampled values read from the memory are related by the following equation:

$$-H_{E-W} \sin(\phi) + H_{N-S} \cos(\phi) = E_z/(Z_0 \sin(\theta))$$

where $\phi$ is the azimuth angle to the lightning stroke and $\theta$ is the elevation angle. The $\theta$ angle for the preferred embodiment is 90° ($\theta$ equals 0° at zenith). Several sample sets of the E and H field values entered in the above equation results in the simultaneous solution of two equations to solve for $\phi$. Because in general each lightning signal is not vertical, the azimuth angle $\phi$ calculation varies from sample sets. By using an iterative calculation of solutions to the above equation, the angle $\phi$ accuracy can be improved by the processing circuit means.

The processing circuit means calculates the range to the lightning by utilizing the low frequency and the high frequency data stored in memory. The first high and low frequency magnetic field data are used in the following equation to estimate the range to the lightning flash:

Ruhnke describes the magnetic fields as:

$$H(w) = \frac{M(w)}{4\pi Z_\epsilon} \left[ \frac{jw}{CR^2} - \frac{(jw)^2}{C^2 R} \right]$$

(See Ruhnke "Determining Distance to Lightning Strokes From a Single Station" NOAA Technical Report E RL 195-APCL 16, January, 1971, pp. 20-23).

The ratio of the measured magnetic fields at two frequencies $H(w_1)$ and $H(w_2)$ is given by:

$$\left| \frac{H(w_1)}{H(w_2)} \right| = \left| \frac{H_{LOW}}{H_{HIGH}} \right| = H_o = \left| \frac{M(w_1)}{M(w_2)} \left[ \frac{\frac{jw_1}{R^2} - \frac{(jw_1)^2}{CR}}{\frac{jw_2}{R^2} - \frac{(jw_2)^2}{CR}} \right] \right|$$

Assuming the ratio of the dipole moment $M(w_1)/M(w_2)$ is a constant $a_1$, the range to the lightning flash is given as follows:

$$R = \frac{C}{w_2} \sqrt{\frac{\left(\frac{a_1 w_0}{w_2}\right)^2 - H_0^2}{H_0^2 - (a_1)^2 \left(\frac{w_0}{w_2}\right)^4}}$$

$$H_0 = \left| \frac{H_{low}}{H_{high}} \right|$$

where:
$H_{LOW}$ is the low frequency total magnetic field
$H_{HIGH}$ is the high frequency total magnetic field
$w_0$ is the frequency of the high frequency measured in radians
$w_2$ is the low frequency of the measurement in radians
c is the constant of free space
R is the range to the lightning flash.

After the direction and range to the lightning is completed, the processor circuitry means compares the new data location to the data at that location which has occurred within a predetermined time period. The processor transmits to the display the location of all lightning activity greater than a predetermined number per the predetermined time period.

Other objects and advantages of the present invention will be apparent upon reading the following detailed description of an illustrative embodiment of the invention in conjunction with the following drawings wherein:

BRIEF DESCRIPTION OF THE DRAWINGS

FIGS. 1a, 1b, and 1c, comprise a functional block diagram of the preferred embodiment of the storm detection apparatus of the present invention.

DETAILED DESCRIPTION OF THE PREFERRED EMBODIMENT

Figure 1A:
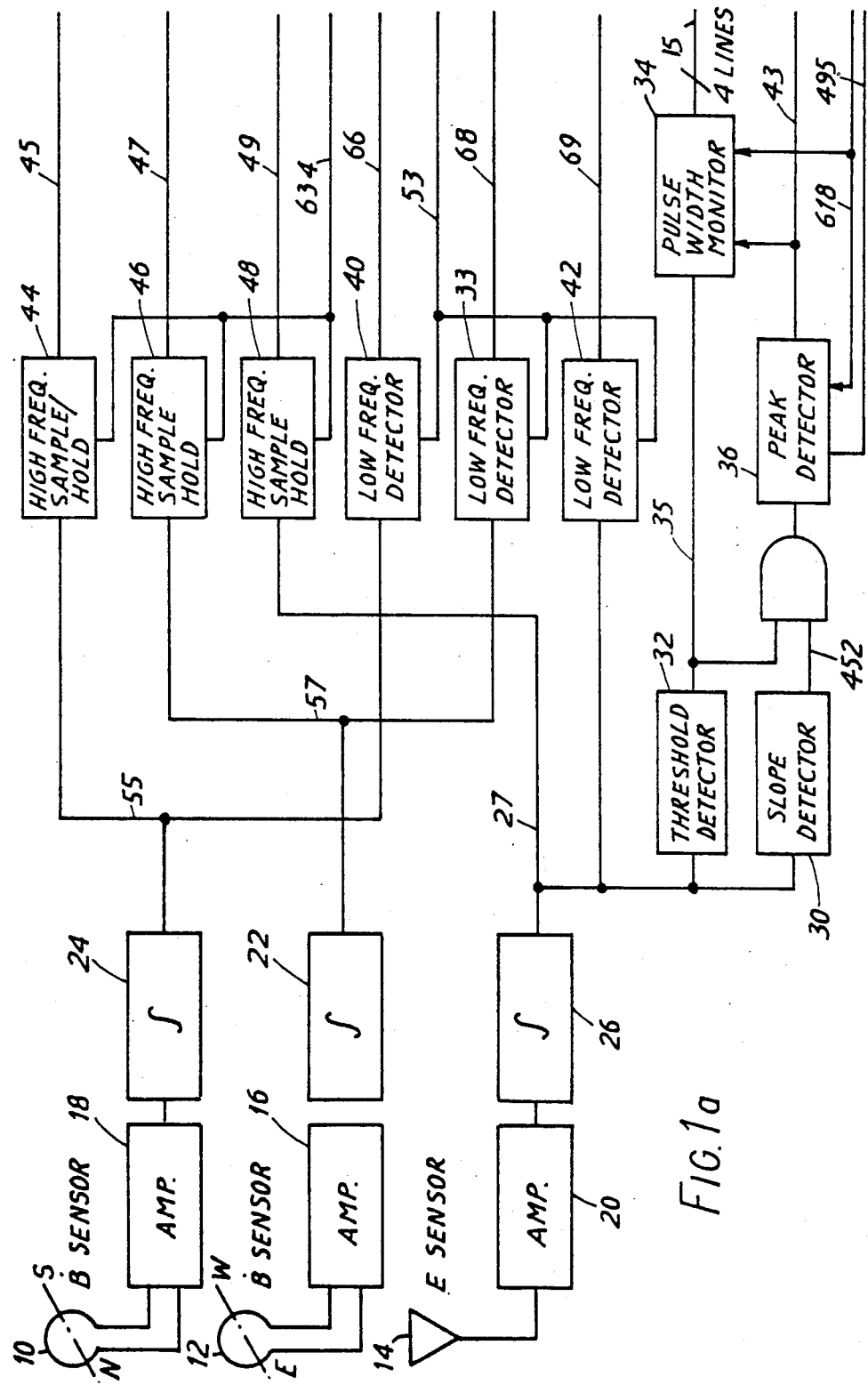
Figure 1B:
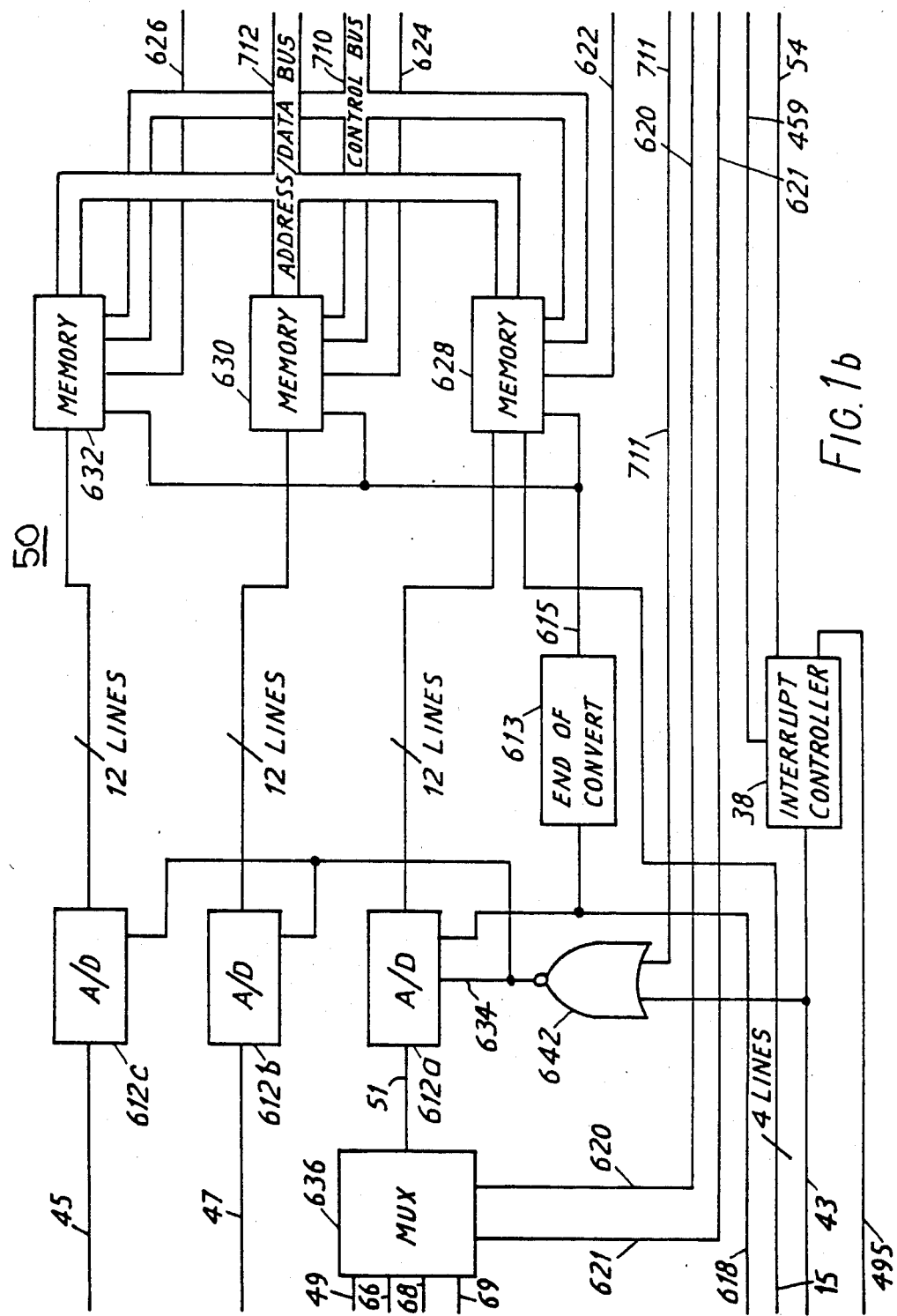

Referring now to FIGS. 1a, 1b and 1c, there is shown a block diagram of a preferred embodiment of the storm warning system of the present invention, generally designated 5. As shown in FIG. 1a, the system 5 comprises a pair of cross loop magnetic field antennas 10 and 12 and an electric field antenna 14. Since the cross loop magnetic field antenna elements have their axes perpendicular to one another, antenna 10 will be referred to as the north/south magentic field antenna while antenna 12 will be referred to as the east/west magnetic field antenna. The three antenna elements are responsive to the time rate of change of magnetic and electric flux densities occurring as a result of electrical activity associated with lightning strikes. The signals received by the antenna elements are transmitted to wide band amplifiers, designated generally 16, 18 and 20, which provide an east/west magnetic field component, a north/south magnetic field component and a vertical electric field component respectively to integrators 22, 24 and 26. In the preferred embodiment, the antenna elements, the integrators and the wide band amplifiers operate over a frequency range of from approximately 1.5 kilohertz to approximately 3 megahertz.

The output of the integrators 22, 24 and 26 are provided in parallel to a sampling portion of the circuitry and to the recognition circuitry portion of the apparatus of the present invention. The recognition circuitry portion comprises slope detection circuitry designated generally 30 and threshold detection circuitry designated generally 32. The output of integrator 26, containing the vertical electric field signal, is transmitted to slope detection circuitry 30 via line 27. If the rise time of this signal is less than a predetermined rise time, a positive signal is transmitted to timer circuitry, generally designated 36, via line 31. Similarly, the electric field signal transmitted from integrator 26 represents the magnitude of the total vertical electric field present at the antenna element 14. This signal is transmitted via line 27 to threshold detection circuitry 32 which provides a positive signal to pulse width monitor circuitry 34 via line 35 if the signal exceeds a predetermined threshold level. The output of the integrator circuitry 26 is also transmitted via line 27 to low frequency detector, generally designated 42. The magnetic field signals from integrators 24 and 22 are transmitted via lines 55 and 57 to low frequency detectors 40 and 33 respectively.

If the voltage level of the electric field signal from the integrator 26 exceeds the predetermined threshold level of threshold detector 32 and if the rise time of the vertical electric field signal from integrator 26 is less than the predetermined rise time of the slope detector 30, then the peak detector 36 is caused to provide a control signal output via line 43 to the pulse width monitor 34, interrupter controller 38 and NOR gate 642 (see FIG. 1b). Low frequency detectors 32, 40 and 42 measure the RMS value of the magnetic and electric field signals over a predetermined time interval which corresponds to the most likely period over which the low frequency lightning signals exist. The slope detector 30, the threshold detector 32 and the pulse width monitor 34 provide a means for recognizing the low frequency magnetic and electric field signals associated with the lightning flash in the presence of interfering and background noise signals.

The north/south and east/west magnetic field signals are also transmitted over lines 55 and 57 to high frequency sample/hold circuits 44 and 46 respectively. The vertical electric field signal from integrator 26 is transmitted via line 27 to high frequency sample/hold circuit 48. Samples of the high frequency magnetic and electric field signals representing the peak of each change in the fields are taken in response to peak detection signals provided from peak detector 36 over line 43. Peak detection signals are generated by peak detector 36 in response to positive output signals from the slope detector 30. The pulse width monitor 34, in response to positive output signals from the threshold detector 32, measures the threshold to peak time of each sample amplitude by monitoring the output of threshold detector 32 on line 35. The pulse width monitor 34 provides threshold to peak time measurement signals over multiple lines 15 to memory 628 (see FIG. 1b).

Referring now to FIG. 1b, the high frequency samples of the magnetic and electric field signals, which are output from high frequency sample and hold circuits 44, 46 and 48 on lines 45, 47 and 49 respectively, are converted to digital signals by analog to digital (A/D) converters 612a, 612b and 612c in response to the peak detection signals via line 43. As shown in FIG. 1b, the signal output from high frequency sample and hold circuit 48 on line 49 passes through a multiplexer 636, the output of which is converted to A/D converter 612a via line 51. A/D converter 612a transmits a high signal to peak detector 36, pulse with monitor 34 (see FIG. 1a) and end of convert circuit 613 via line 618 which disables peak detector 36 while the A/D converter 612a is activated. The end of convert circuit 613 transmits a high going low signal via line 615 at the end of the A/D converter cycle. The digital signals from A/D convertor 612a, along with the pulse width signals provided by the pulse width monitor 34 over lines 15 are stored in first-in first-out (FIFO) memory 628 by a store enable signal output from the end of convert circuit 613 over line 615. Similarly, the low frequency electric and magnetic field signals from low frequency detectors 40, 42 and 33 pass through multiplexer 636, A/D converter 612a and are stored in FIFO memory 628.

Referring to FIG 1c, the system further comprises processing circuitry means designated generally 52. When the predetermined integration interval corresponding to the existence of the lightning stroke is ended, the interrupt controller 38 (see FIG. 1b) transmits an interrupt control signal via line 54 to the processing circuitry means which, in response thereto, commands the memory 628, 630 and 632 of the processing circuitry 50 via multiple lines 622, 624, 626 and 628 to transmit the high frequency samples of the magnetic and electric field values via data bus 712 to random access memory (RAM) 703. The processing circuitry 52 commands, over line 53, low frequency magnetic and electric field data to be held by the low frequency detector circuit 33, 40 and 42. Next, the processor 52 commands, via lines 620, 621 and 711, the A/D converter 612a to convert the low frequency signals of lines 66, 68 and 69 from analog to digital form. This information is utilized in accordance with the programming of the processing circuitry means to calculate the region of activity of the lightning stroke. The results are transmitted to the display means 62 which then displays the results on a CRT display. The display means 62 comprises a display processor and CRT display. The processing circuitry means 52 is enabled to compensate for movement of a host platform (such as a aircraft) when determining the region of lightning activity by monitoring, via multiple lines 732, aircraft heading direction which is provided by syncro to digital converter 740.

The north/south magnetic field antenna 10 and the east/west magnetic field antenna 12 (see FIG. 1a) preferably consists of three turns of semiridge cable (preferably 0.082 inch diameter) which have gaps at the top of each turn. The two outputs of the shield loop are connected to a 180° summer. The output of the 180° summer is then filtered by a seven pole butterworth filter. The electric field antenna 14 preferably consists of a thin copper sheet bonded to the inside of the antenna radome structure. The copper sheet is connected to a seven pole butterworth filter which converts the antenna output to 50 ohms and filters signals above three megahertz. The antenna radome is preferably a six-inch long blade designed for a subsonic airplane. An aircraft flying 500 knots will experience a drag force of approximately 30 pounds at sea level and 15 pounds above 20,000 feet.

Figure 2:
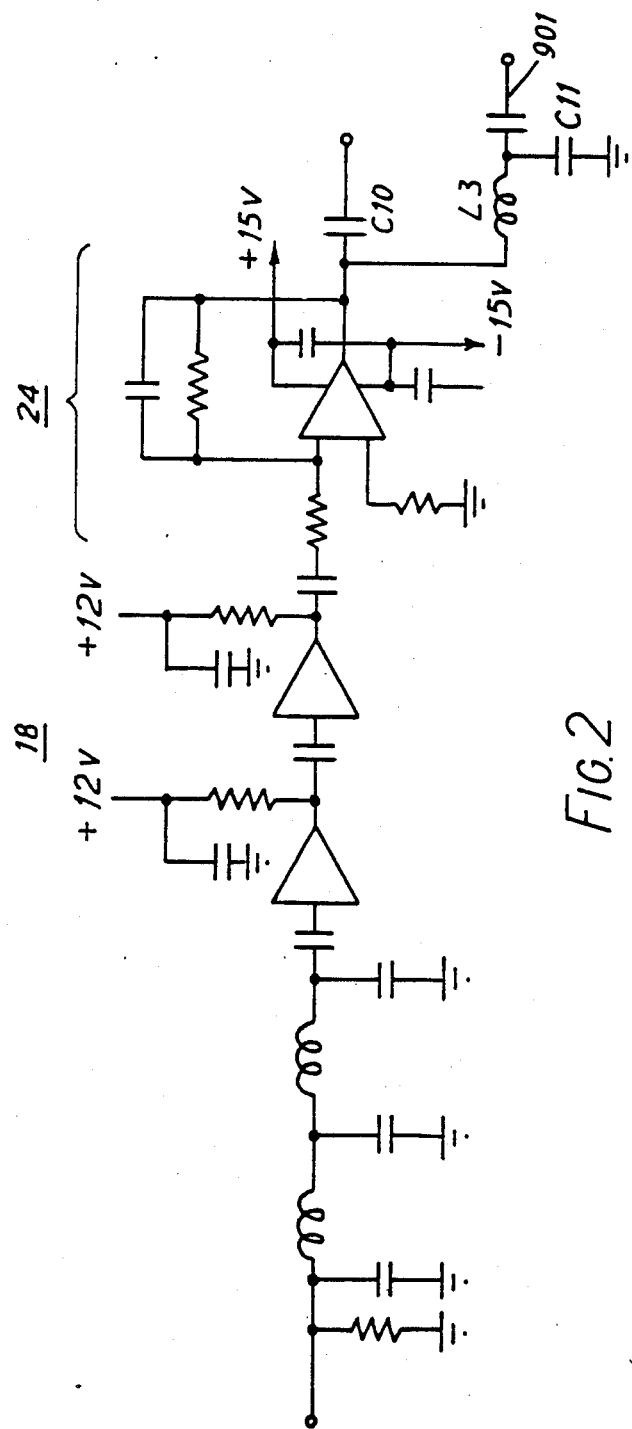
FIG. 2 is a schematic diagram of the preferred embodiment of the wide band amplifiers and integraters of the apparatus of the present invention.

Referring now to FIG. 2, there is shown a schematic diagram of the preferred embodiment of one of three wide band amplifiers 20, 18, 16 as well as integrators 26, 24 and 22. The input to the amplifier is a five pole butterworth low pass filter. The two stage amplifier preferably provide a gain of 28 db. The maximum input signal to cause one db compression at the output of amplifiers is $-10$ db. For a lightning strike at a distance of two kilometers, the output will be 10 db below the 1 db compression point and may be sampled without distortion. The amplifier is AC coupled to an integrator U3. The combined low frequency gain of the integrator and the wide band amplifier is 80 db. This offsets the antenna gain loss. The lightning signal at 1.5 kilohertz and at a distance of 10 kilometers will have an output signal substantially equal to 11.5 dbm. The low frequency signal is a narrow band filtered, preferably 200 Hz, by L3 and C11. The output of integrator U3 is also AC coupled by capacitor C10 to provide the high frequency pulses over lines 55, 57 and 27. The decay constant of the integrator is 45 microseconds.

Figure 6:
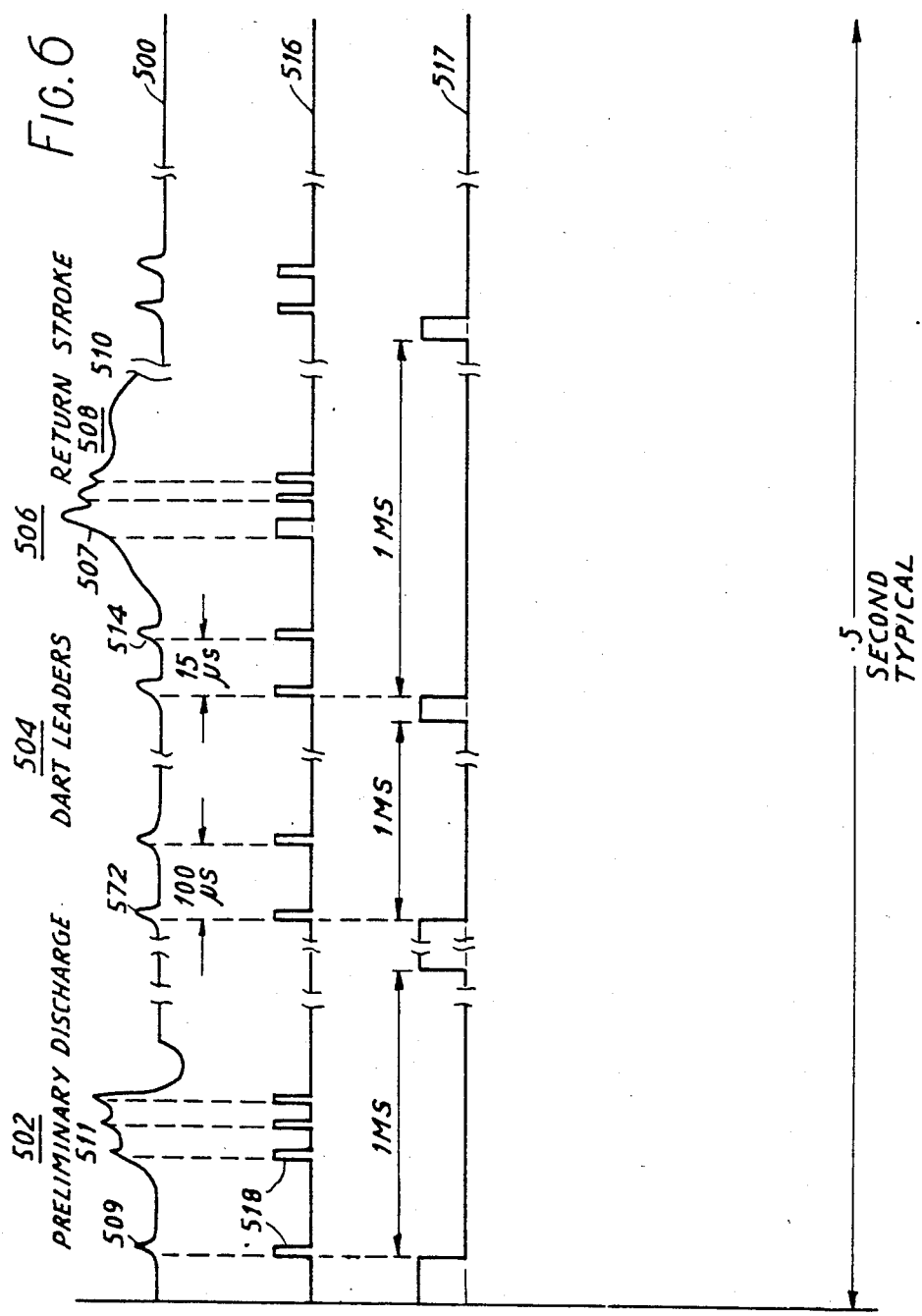
FIG. 6 depicts the signals of a lightning stroke in relation to a timing diagram for the apparatus of the present invention.

Referring now to FIG. 6, there is shown a curve, generally designated 500, which represents the vertical electric field $E_V$ signal output from integrator 26. The ordinate in each curve represents voltage amplitude in millivolts and the abscissa represents time in microseconds. Inspection of the curve shows that the E field voltages associated with a single lightning flash (many strokes comprise a lightning flash) usually lasts approximately 0.5 second. The lightning flash is usually composed of a preliminary breakdown (see area 502 on curve 500), stepped-leaders (see area 504 on curve 500), return stroke (see area 506 on curve 500), continuing currents (see area 508 on curve 500), and interstroke intervals (see area 510 on curve 500). Research in the nature of electrical signals arising from lightning strokes indicates that almost all vertical electric field voltages ($E_V$) for the return stroke will have an initial rise time (see area 507 on curve 500) of less than five microseconds; and that the flash will contain a plurality of randomly placed smaller pulses or peaks of submicrosecond duration and rise times of less than five microseconds. See for example positive slopes 509, 511, 512 and 514 on curve 500.

Figure 3:
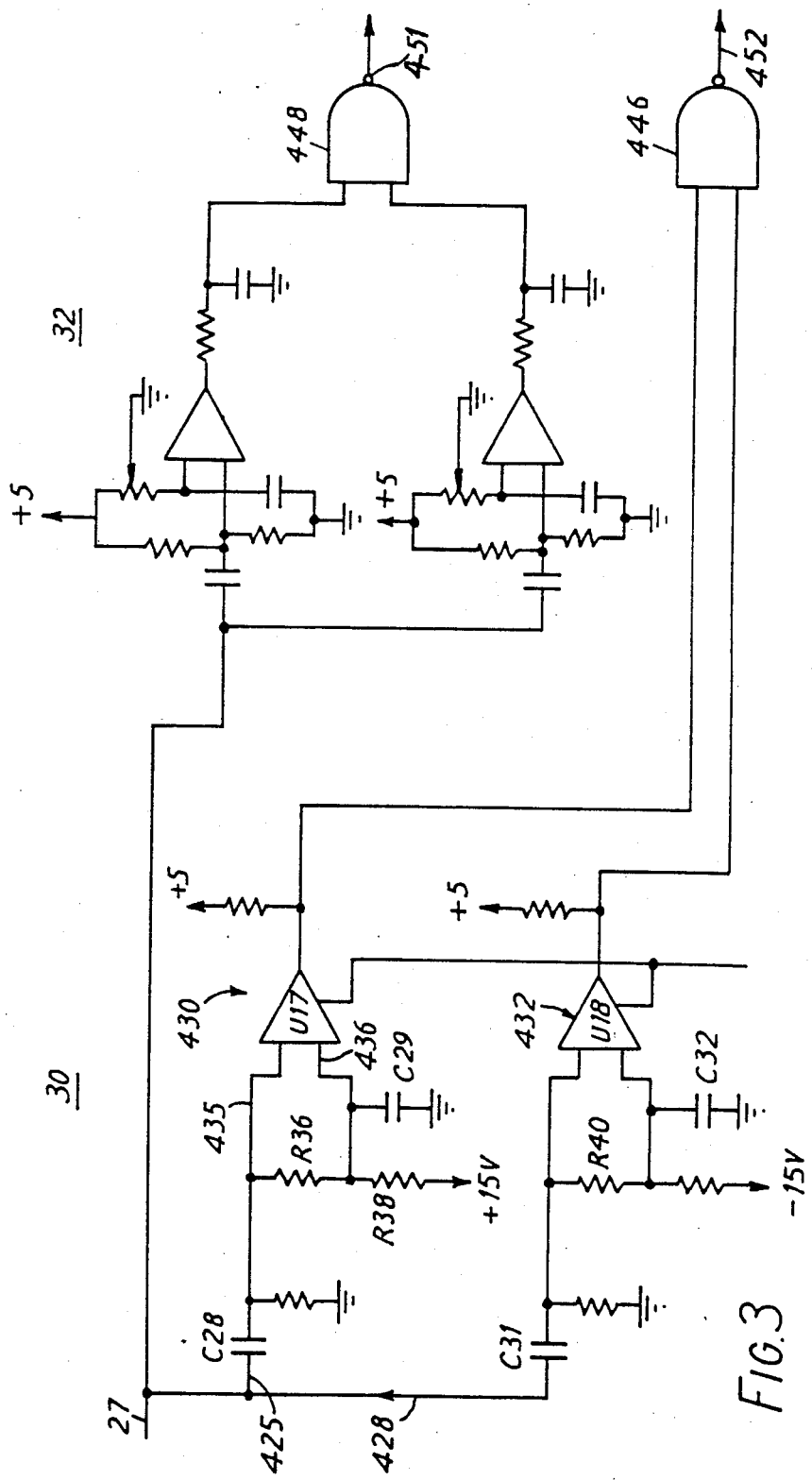
FIG. 3 is a schematic diagram of the recognition circuitry of the apparatus of the present invention.

The recognition circuitry, as shown in FIG. 3, takes advantage of the aforementioned characteristics to cooperate with the threshold detector 32 and interrupt controller 38 to furnish control signals via linnes 43 and 53 for low frequency detection and high frequency sampling of the E and H field voltages. As shown in FIG. 3, the vertical electric field voltage $E_V$ is transmitted from integrator 26 via line 27 (see FIG. 1) and then lines 425 and 428 through DC blocking capacitors C28 and C31 to the slope detector 30. Slope detector 30 comprises two parallel similar circuits designated generally 430 and 432. U17 is an operational amplifier with TTL output; and, in the preferred embodiment, is a Signetics Model No. SE529 with two inputs, 435 and 436. Input 435 is connected to input 436 through a resistor R36 and input 436 is connected to ground through a capacitor C29. Operational amplifier U17 will provide a negative output voltage to NAND gate 446 whenever the field voltage $E_V$ increases faster than capacitor C29 can charge through resistor R36. The product of resistor R36 and capacitor C29 determines the sensitivity of the slope detector 30. In the preferred embodiment, this product is set to be equivalent to a lightning signal change of 40 volts per microsecond and thus allows only the submicrosecond lightning pulses to be detected. Input 436 is a positive voltage bias through resistor R38 and the ratio of resistors R36 and R38 sets the minimum signal level which the slope detector 30 will detect. The preferred embodiment is set at 15 millivolts, corresponding to a lightning range of 200 KM.

Similarly, circuitry 432 comprises operational amplifier U18 (preferably Signetics Model No. SE529) which provides a negative output to NAND gate 446 whenever field voltage $E_V$ decreases faster than capacitor C32 can charge through resistor R40. Either a positive or negative voltage change of $E_V$ having the correct rise time as functionally defined by circuitry 430 and 432 will provide a negative input to NAND gate 446. If no fast rise time occurs, the outputs of operational amplifiers U17 and U18 will be high. Examples of submicrosecond pulses which will trigger the above described circuitry is shown as slopes 507, 509, 511, 512 and 514 in FIG. 6. When the slope of the proper rise time (either positive or negative) occurs on the $E_V$ voltage pulse 500, one of the operational amplifiers U17 or U18 will go low causing the output of NAND gate 446 to go high until the peak voltage on the pulse on curve 500 is reached and then the output of NAND gate 446 will go low. For example see FIG. 6, curve 516, where the output of NAND gate 446 is shown as the series of pulses 518 corresponding to fast rise times on the $E_V$ signal 500.

Figure 4:
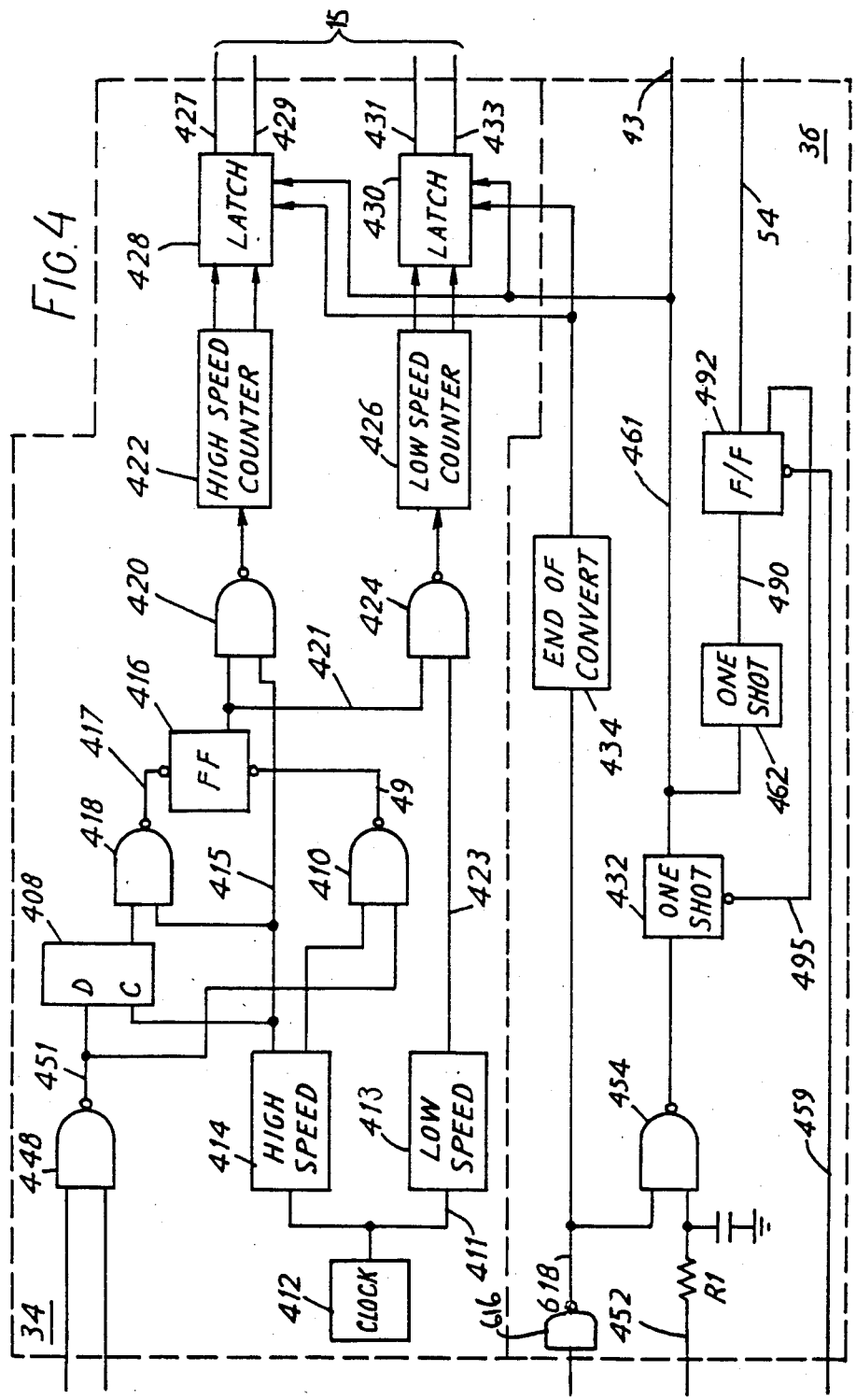
FIG. 4 is a logic diagram of the peak detector and pulse width monitors portion of the apparatus of the present invention.

The output of NAND gate 446 is transmitted through R1 to NAND gate 454 as shown in FIG. 4. Threshold detection NAND gate 448 transmits a high to the flip-flop 408 and NAND gate 410 via line 451. Flip-flop 408 input from line 451 is clocked to NAND gate 418 on the rising edge of the clock signal via line 415. The clock signal provided by the high speed clock 414 is generated in the preferred embodiment by a 74LS393 counter. The high speed clock signal provided by line 415 has a frequency which is preferably equal to two megahertz. The high signal provided by NAND gate 448 is transmitted to flip-flop 408 output on clock 415 rising edge and is provided as a low to the set input of flip-flop 416 via line 417. A low signal via line 417 causes the flip-flop 416 output to be high.

A high signal on line 421 enables the NAND gates 420 and 424. The low speed clock 416 has as input the master clock signal via line 411. A 74LS399 is used to divide the master clock to 250 kilohertz. The low speed clock signal is provided to low speed counter 426 via line 423 and NAND gate 424 when enabled by a high on line 421. Likewise, the output of high speed clock 414 is provided via NAND gate 420 to high speed counter 422 when enabled by the high signal on line 421. Outputs of the low speed counter 426 and high speed counter 422 are provided to lines 427, 429, 431 and 433 via latches 428 and 430. Output lines 427, 429, 431 and 433 are changed at each peak detect signal provided over line 461 which represents the time which the peak of the pulse occurred since the signal was above a minimum threshold. As the data ready signal provided by line 618 goes from high to low, the end of convert circuit 434 provides a high reset pulse to latches 428 and 430. In the preferred embodiment, latches 430 and 428 are 74LS197. Also in the preferred embodiment, the high speed counter 422 and low speed counter 426 are 74LS393.

Whenever slope detection circuitry causes a low going high signal at the input to one shot 432 (this output goes high when the fast rise time pulse from integrator 26 peaks) one shot 432 generates a 250 nanosecond pulse on line 461. The falling edge of the pulse causes the data inputs to latches 428 and 430 to be set as outputs 427, 429, 431 and 433 respectively. This 250 nanosecond high signal on line 461 is one of the control signals generated by peak detector 36 and is called the peak detection signal. The peak detection signals are shown on curve 518 of FIG. 6. Note that they occur on the leading edge of the high going signal from NAND gate 454.

Figure 5:
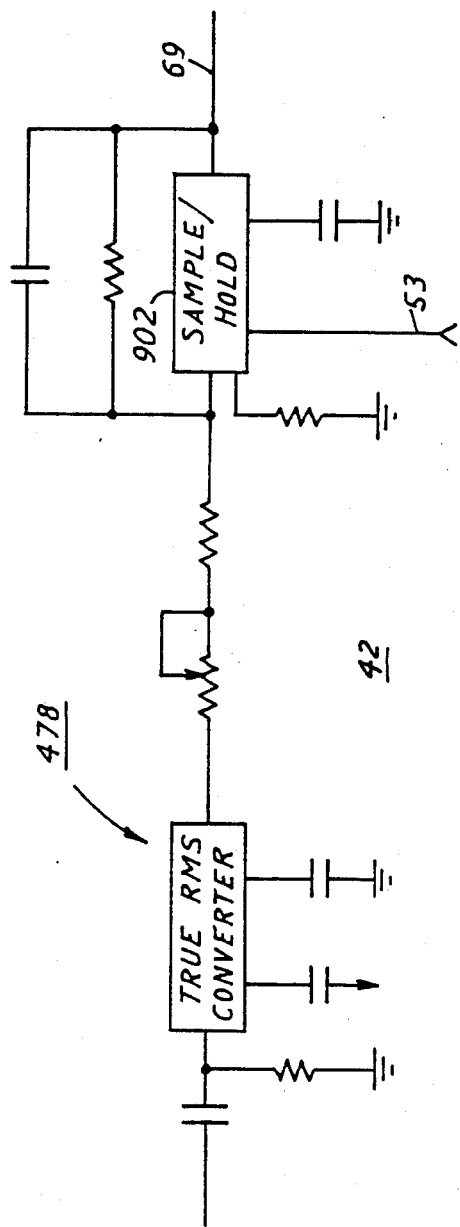
FIG. 5 is a schematic diagram of one of three low frequency detectors of the apparatus of the present invention.

The electric field from integrator 26 is also transmitted via line 27 (see FIG. 1a) to low frequency detector 42 which comprises a true RMS detector and sample/hold circuitry designated generally 478 (see FIG. 5). A true RMS measurement of the $H_{EW}$, $H_{NS}$ and $E_V$ field voltages are made accurately in the preferred embodiment by a commercially available device Analog Devices Model No. AD536 (a peak detector of the low frequency signal could also be used). The design implements the auxiliary dB output of the AD536A as described in the Analog Devices Data Acquisition Products Catalog, 1978 edition, pages 229-234 which is incorporated by reference as if fully set forth herein. Input to the RMS converter 900 is from the low frequency output lines 901 (see FIG. 2). The output of RMS converter 900 is connected to sample and hold (S/H) circuit 902. The low signal from processing circuitry means via line 53 is connected to S/H circuit 902. On the rising edge of the low signal, the S/H circuit 902 holds the integrated voltages while the processing circuitry means converts and stores them as digital data. In the preferred embodiment, the S/H circuit 902 is a Harris Corporation Model No. HA-2420-8 device.

Referring again to FIG. 4, the output of one shot 432 is connected to one shot 462. The Q output of one shot 462 is connected via line 490 to flip-flop 492. When the 1 millisecond interval is over and the Q output of one shot 462 goes high, it sets flip-flop 492 causing a high signal to be transmitted via line 54 to the processing circuit 52 as an interrupt signal (see FIG. 1c). At the same time, flip-flop 492 $\overline{Q}$ goes low and is transmitted via line 495 as an inhibit data measurement signal to one shot 432. The low signal disables one shot 432 while the processing circuit 52 interrogates preprocessing circuit 50 for the sampled and integrated E and H field voltages. When the processing circuit 52 has finished interrogating the preprocessing circuit 50, it transmits a clear signal to flip-flop 492 via line 459 which results in enabling 432 and disabling the high interrupt signal 54 to the processing circuit 52 from flip-flop 492.

Figure 7:
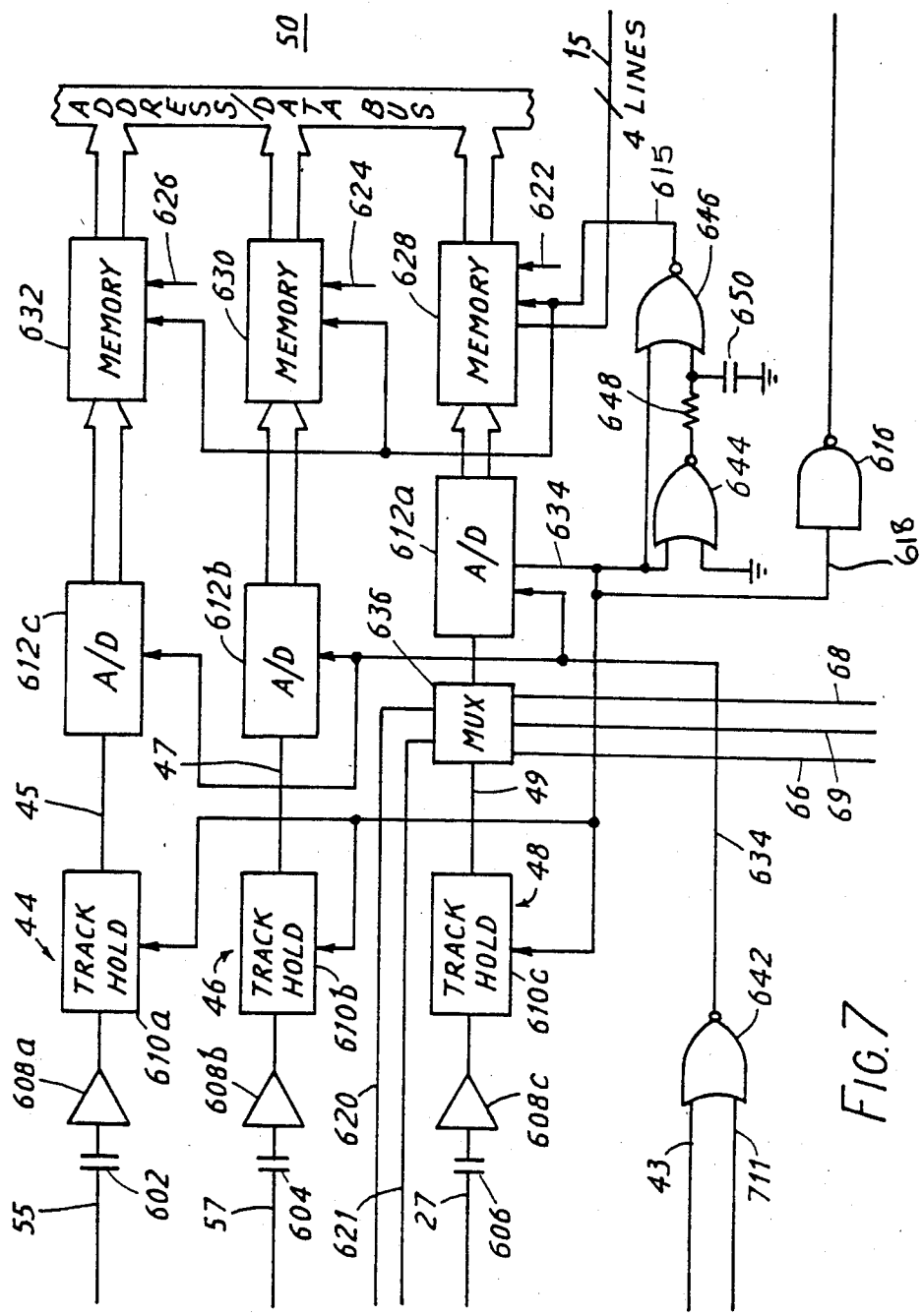
FIG. 7 is a functional block diagram of the electric and magnetic field sampling portion of the apparatus of the present invention.

FIG. 7 shows the high frequency sample/hold circuits 44, 46 and 48 and preprocessing circuit 50 of FIG. 1 in more detail. Capacitors 602, 604 and 606 block unwanted DC components from the signals $E_V$, $H_{NS}$ and $H_{EW}$ respectively furnished over lines 27, 55 and 57 but pass the high frequency signals. The high frequency signals are then transmitted through buffer circuitry 608a, b and c (Analog Device Model No. AD 509 in the preferred embodiment) before being forwarded to track and hold circuit 610a, b and c. The track and hold circuits (Analog Devices Model No. HTC-0300 MM in the preferred embodiment) in response to the peak detection control signals from one short 432 over line 43 (see FIGS. 1 and 7) holds the peak field voltage constant. The voltage held by track and hold circuit 610a, b and c is the peak voltage occurring in the $E_V$ voltage 500 (see the slopes 507, 509, 511 and 512 in FIG. 6).

Each peak field voltage signal held by track and hold circuits 610a, b and c is converted to a digital signal by analog to digital (A/D) converters 612a, b and c in response to the rising edge of the peak detection signal from line 43 and causes a high signal on lines 634. In the preferred embodiment, the A/D converters 612a, b and c are Datel-Intersil Devices, Model No. ADC817MM, which convert the analog signal into a twelve bit digital signal in 2.5 microseconds when the conversion is complete. A/D converter 612a then transmits a high signal over lines 634 and, on the falling edge, causes NOR gate 646 to output a low going high signal. This causes the digital sampled peak field voltage and the voltage 427, 429, 431 and 433 to be clocked into the first-in first-out (FIFO) memory 628 where they are stored until called for by the processing circuit 52. As described earlier, each peak signal on waveform 500 ($E_V$) in FIG. 6 which has a rise time less than or equal to five microseconds causes a peak detection signal which then causes a sample of the $E_V$, $H_{NS}$ and $H_{EW}$ field signals to be taken and stored in memories 628, 632 and 630 during the one millisecond interval (signal 517 in FIG. 6) generated by the Q output of one shot 468 in FIG. 4. In the preferred embodiment, memories 628, 630 and 632 are Advanced Micro Devices, Model No. AM 2841.

When the A/D converts generate rising edge signals over lines 634 to NAND gate 616, NAND gate 616 transmits a low data ready signal over line 618 to NAND gate 454 (see FIG. 4). This disables one shot 432 from generating a new peak detection signal. If the data ready signal were not used to enable one shot 432, a second closely occurring peak voltage signal on waveform $E_V$ would generate a second peak detection signal causing the A/D conversion process of the first sample signal to be interrupted. The high signal over line 634 causes the capacitor 650 to charge to a high signal via resistor 648 and NOR gate 644. On the falling edge of the signal on line 634, NOR gate 646 is enabled to generate a low signal over line 652 for a period of time determined by the product of resistor 648 and capacitor 650. The control signal on line 652 enables the transmission of the twelve bit A/D digital signals to FIFO memories 614a, b and c.

The processing circuit 52 is described in block diagram form in FIG. 1c. The processing circuit comprises a controller 56, random access memory (RAM) 703, read only memory (ROM) 704, read only memory (ROM) 706, arithmetic processing unit 707, and an address data bus 712. The various portions of the processing circuit 52 are connected together by the address/data bus 712.

The processing circuit 52 is programmable, the programs being stored in ROMs 704 and 706. After the processing circuit 52 has finished processing data and is ready to receive new data from a new lightning strike, it transmits a data clear signal to flip-flop 492 (see FIG. 4) over line 459. Line 459 is shown connected to the RAM 703. When a lightning strike is recognized by the recognition circuit shown in FIG. 3, a one millisecond integration and sampling time is set by a low Q output of one shot 468 as described earlier. When this one millisecond interval is over, the change in state of the output of one shot 462 sets flip-flop 492 providing an interrupt signal over line 54 to the controller 56.

The processing circuit 52 is now ready to read the data via bus 712. The data to be read are the sampled high frequency $E_V$ and $H_{NS}$ and $H_{EW}$ field values stored in the FIFO's, the pulse width data stored in FIFO 628 and the low frequency $E_V$ and magnetic field values transmitted from low frequency detectors 32, 40 and 42. To accomplish this, the processing circuit 52 transmits sample data conntrol signals over lines 622, 624 and 626 (FIGS. 7 and 1a) from the controller 56. Controller 56 provides an address to bus 712 and control signals on bus 710 to decoder 623 which in turn provides interrogation signals over lines 622, 624 and 626 to memories 628, 630 and 632 respectively. The memories 628, 630 and 632 are connected to the address/data bus 712 and control bus 710.

Control lines 620 and 621 from random access memory 703 are connected to multiplexer 636 (see FIG. 7). Multiplexer 636 is connected between track and hold circuit 610c of high frequency sample/hold circuit 48 and A/D converter 612a. The low frequency vertical electric field from low frequency detector 42 (see FIG. 5) is transmitted via line 69 to multiplexerr 636 while the low frequency magnetic field from low frequency detectors 40 and 32 are transmitted via lines 69 and 68 to multiplexer 636 in response to command signals transmitted over lines 620 and 621. The processing circuit 52 transmits an A/D convert command over line 711 to A/D converter 712a via NOR gate 642. At the completion off an A/D conversion, the digital data is transmitted to FIFO 628.

Assuming that the circuitry of FIG. 4 is cleared to accept data from a lightning strike, and is recognized by the circuitry of FIG. 3. One shot 462 generates a one millisecond pulse in a manner as described previously. As the one millisecond interval ends flip-flop 492 is set and a high interrupt signal is transmitted therefrom via line 54 to the controller 56. This signal initiates a sample data interrupt program stored in ROMs 704 and 706. The signals via lines 620 and 621 are changed by the processing circuitry means. The decoder 623 transmits a signal via line 622 to memory 628. A read sampled $E_V$ data signal over control bus 628 from the processing circuit 52 causes the sampled $E_V$ data and pulse width data stored in FIFO 628 to be transmitted via address-/data bus 712 to RAM 703. The sample data interrupt program transmits an address signal via lines 620 and 621 to multiplexer 636 and a command signal via line 711 to read the low frequency vertical electric field value over line 69 into A/D converter 612a where it is converted into digital form.

Next the address over lines 620 and 621 is changed so that multiplexer 636 reads the low frequency magnetic field value from line 68 into A/D converter 612a where it is converted into digital form. Finally, the address over lines 620 and 621 is changed so that multiplexer 636 reads the low frequency magnetic field value from line 66 into A/D converter 612a where it is changed into digital form. The digital values of the low frequency electric and magnetic fields are transmitted to FIFO 628 on the falling edge of control line 634. Next address signals are transmitted from controller 56 via bus 712 to decoder 623. Decoder 623 transmits a signal via line 622 to memory 628 and processing circuitry means transmits a read sample $H_{NS}$ data signal via bus 710 to FIFO 630. The date in FIFO 630 is then read via address/data bus 712 into the random access memory 703. Finally, the signals via bus 712 are set by controller 56 so that the decoder 623 transmits a signal via line 624 to memory 630 which then reads the sample $H_{EW}$. These also are stored in RAM 703. When all the data has been read from the FIFO memories 628, 630 and 632, a sampled data program is called for.

The sampled data program also stored in ROM 704 and ROM 706 utilizes the sampled high frequency and low frequency E and H field values of the lightning stroke to calculate the direction and to measure the range of the lightning activity.

The direction is calculated in terms of an azimuth angle $\phi$ existing between the location of the lightning and the antennas 10, 12 and 14. As described earlier, each fast rise time pulse present in the lightning stroke triggers the circuitry (described earlier) to sample the E and H fields radiated by the lightning stroke. For each sample taken (where each sample corresponds to one pulse in the lightning stroke), three values $E_V$, $H_{NS}$ and $H_{EW}$ are measured by the three antenna elements. For one lightning stroke in the preferred embodiment, a maximum of 30 sets of three sampled field vlaues are measured and stored during the first 1 millisecond.

As described earlier, the sampled field values are related by the equation, $$-H_{EW}\operatorname{Sin}(\phi) + H_{NS}\operatorname{Cos}(\phi) = \frac{E_z}{Z_o \operatorname{Sin}(\theta)}$$

This equation can be solved by using at least two different threesomes of the sampled field values in the set. The sampled data program using the equation above (assuming Sin ($\phi$) equals one) calculates $\phi$ using at least two threesomes of sampled field values from the set of sampled field values stored for each lightning stroke. The sampled data program calculates $\phi$ a plurality of times for each combination of two different threesomes found in the set (maximum of 30 in the preferred embodiment). Each time the program calculates $\phi$ it checks its validity as described above. In general, all pairs of $\phi$ will not agree exactly because of non vertical lightning signals. The program estimates the correction to the calculated $\phi$ necessary to satisfy the above equation.

The sample data program calculates the centroid value of the plurality of $\phi$'s calculated. This is the direction angle to the lightning flash from the equipment. The centroid value is based upon data collected during a predetermined period of time. In the preferred embodiment, this predetermined time period is one millisecond and there are several one millisecond data collection time periods during the occurrence of a lightning flash. Next, the program calculates the standard deviation of the set of calculated azimuth angles. The standard deviation will be used to display the lightning activity as a region of activity rather than an isolated point. The standard deviation along with the mean angle $\phi$ is stored in RAM 703.

The sample data program looks for pulses with durations of longer than 1 microsecond but less than 10 microseconds by examining the data stored RAM 703 associated with the pulse width measurement for each high frequency sample. Sample data pulse widths less than 1 microsecond represent lightning predischarge or leader signals and do not in general have the low frequency signals present. Once the sample data program calculates a sample pulse with a time duration of greater than two microseconds for the preferred embodiment, the low frequency signal stored in RAM 703 for the E field measured during this 1 millisecond period is compared to the low frequency measured during other 1 millisecond periods of this lightning flash (FIG. 6 depicts the total lightning flash). For the largest low frequency E field signal detected, its corresponding low frequency H field signal is used in the following equation to determine range:

$$R = 18.03 \sqrt{\frac{10 - \left(\frac{H_{low}}{H_{high}}\right)^2}{\left(\frac{H_{low}}{H_{high}}\right)^2 - 9000}}$$

where $a_1$ equals 0.11 derived from experimentation
$w_1$ equals approximately 263,893 radians/sec
$w_2$ equals approximately 8,984 radians/sec
c is constant of light 161,987 nm/sec
R is range in nautical miles.
$H_{low}$ is the total low frequency H field signal detected during the above described 1 millisecond period
$H_{high}$ is the corresponding maximum high frequency H field signal for the same period.

This equation has the advantage over prior art of no ambiguous range values in contradistinction to the absolute value of the ratio of the magnetic field, H, to the electric field, E, which varies with the range from the lightning stroke. The above equation may be stored in ROM 706 as a table of ratios relating to a specific range. The estimted range to the lightning flash is stored in RAM 703. The sample data program translates the lightning flash location into a fix earth position. The fix earth position is determined by a main program stored in ROM 706 when the processor 52 is initially turned on. THe following equations are used to translate the new data:

$XP = R \cos (\phi)$ $YP = R \sin (\phi)$ $X = XP \cdot \cos (\theta) + YP \sin (\theta) + RAXO$ $Y = YP \cdot \cos (\theta) - XP \sin (\theta) + RAYO$ where
$\phi$ is the angle to the flash
R is the range to the flash
RAXO is the present X position of aircraft
RAYO is the present Y position of aircraft
$\theta$ is the present aircraft heading.

Following the calculation of location to each pulse in a fixed earth coordinate, it is desirable to known the region having the most activity lightning. All sample point locations are stored in RAM 708 in a buffer area defined as G1. A schedule routine program (more detail is provided later) removes sample points from G1 which are older than four minutes. The sample data program uses the data base of all lightning locations which occurred within the last four minutes to define activity region boundries and saves the data in buffer G2 for display. The test for inclusion of a set of lightning samples for display is defined as follows:
G1 = $(P_o:P_n)$ all new lightning points
G2 = $(P_o:P_m)$ points which exhibit clustering New lightning location $P_i \epsilon G1$. is tested for inclusion in G2.

$P_i \epsilon G2$ if $di \leq dp$

That is, every lightning point whose distance from at least one other point is less than or equal to a constant dp stored in ROM 704.

It should be understood from the above description of sample data program thus far, that the method and apparatus of this invention provides circuitry and microprocessing power which uses a great deal of the detailed electromagnetic field information resulting from a lightning strike to determine accurately the range and region of activity of the lightning strikes relative to the equipment. For example, as previously stated, the method and apparatus of the present invention utilizes the ratio of the magnitude of the magnetic (H) field measured at a first frequency to the magnitude of the H field measured at a second frequency to determine range. Note that in the preferred embodiment, the first frequency is lower than the second frequency; however, range information can also be determined in accordance with the present invention when the first frequency is higher than the second frequency and such is within the scope and contemplation of the present invention.

Now that the direction and distance of the lightning activity relative to the observing equipment is calculated, it must be displayed. But first, the distance calculated thus far must be adjusted for the range scale factor which is controlled by a switch 736 in FIG. 1c. This manual selection of scale factor is monitored via lines 739 and 738 by the schedule routine program stored in ROM 704. The schedule routine program is executed by controller 56 every 10 milliseconds. A detailed description of the design and software programming techniques using the INTEL 8085A for a minimum system is found in INTEL Component Data Catalog, 1980 edition, pages 6-9 through 6-24 which is incorporated by reference as if fully set forth herein. The controller 56 is interrupted once every 10 milliseconds by the clock output provided by RAM 702 (the INTEL Component Data Catalog completely explains the use of the timer output connection). The schedule routine program first determines if 0, 200, 500, 700 and 900 milliseconds (10 interrupts from RAM 703 equals 100 milliseconds) has been completed. At the 0 millisecond time the range input lines are monitored over lines 738 and 739. This range scale factor is stored in RAM 703 and is used to offset the range calculated by the sample data program. The schedule routine program calculates the true range on every 900 millisecond count and updates the display. This is accomplished by translating the x and y fixed earth rectangular coordinates of the lightning flash into the aircraft coordinates and the results provided to the display means 62. The x and y coordinates are translated into aircraft coordinates as follows:

$X = R \cos (\phi) - RAXO$ $Y = R \sin (\phi) - RAYO$ $XP = I \cdot \cos (\phi) + Y \sin (\theta)$ $YP = -X \cdot \sin (\theta) + Y \cos (\theta)$ The display processor is programmable and the information provided to it can be displayed and the display updated in a variety of ways. Display systems including a display processor, a display under the control of the display processor and programs for use by the display processor are commercially available along with an interface for accepting the information to be displayed. One such display system suitable for use with the present system is a DIGITUS Corporation Rainbow 2000 System. See in particular DIGITUS Corporation Users Manual which is hereby incorporated by reference as if fully set forth herein.

One such program shows the equipment origin at the center of the display with azimuth angle varying 360° about the origin. The farther away the lightning stroke is the farther away from the origin is the indication. The uncertainty to precise distance is shown as a shaded circle based on the number of sample points included in the set of lightning samples G2. It is clear from the design thus far, the range scale can be varied by the switch 736.

The program also allows for variation in how often the display is updated with new information; how long old information is retained; and the use of color or intensity to differentiate between intensity levels of the storm based on similarities between old and new information about the lightning activity.

The ability to locate and track electrical activity by aircraft is extremely important. In an aircraft the lightning activity is displayed relative to the heading of the aircraft. The nose of the aircraft points at zero degrees azimuth. However, the speed and direction of aircraft flight constantly changes the location of the lightning activity relative to the aircraft. To compensate for this the processing means is programmed with the schedule routine program previously discussed in above paragraph, which updates the RAXO and RAYO coordinates of the aircraft in the fixed earth coordinates. Heading information from the aircraft's navigational system is transmitted via a plurality of lines 732 to synchro to digital converter (S/D) 740 in FIG. 1c. The heading information is analog in nature which the synchro to digital device 740 converts to digital data when processing circuitry means transmits a command over line 734. In the preferred embodiment, Model No. HXDC10-L-3, made by ILC Data Device Company, is used as the synchro to digital device 740.

The change in azimuth display, caused by the aircraft heading (HEA), is calculated by the schedule routine program on the 900 millisecond count by subtracting the previous heading from the latest. The change in RAXO and RAYO coordinates of the aircraft is calculated by using the aircraft heading azimuth angle HEA:

RAXO = Speed sin (HEA)
RAYO = Speed cos (HEA)

where speed is the known speed of the aircraft stored in ROM 704 (this may be input from the aircraft navigation system) with value set in accordance to type of aircraft. For example, a Cessna 182 aircraft has a nominal cruising speed of 120 NM. The schedule routine program updates the display every second.

Finally, the sample data interrupt and sample data programs will operate when triggered by randomly occurring lightning strokes. These will not always occur every tenth of a second when heading is being updated. It is desirable to use the latest heading information possible, between sampled headings at 200, 500, 700 and 900 milliseconds. The sample data program will use the latest heading information available when calculating azimuth and range to the lightning flash.

It will be understood that various changes in the details and arrangements of the system and its components which have been herein described and illustrated in order to explain the nature of this invention, may be made by those skilled in the art within the principle and scope of the invention as expressed in the following claims.

I claim:

1. An apparatus for determining the location of lightning strokes, each lightning stroke generating electric (E) and magnetic (H) field components, said apparatus comprising:
   a. receiving means for receiving separately the electric (E) and magnetic (H) field components of a lightning stroke and for generating electrical signals associated with said E and H field components, said electrical signals being characterized by an initial rise time and a plurality of subsequent sub-pulse rise times;
   b. means coupled to said receiving means for determining the direction to said lightning stroke relative to said apparatus by operating upon said electrical signals associated with both said E and H field components; and
   c. means coupled to said receiving means for determining the distance to said lightning stroke from said apparatus by operating upon said electrical signals associated with said H field component, said distance determining means comprising:
      1. means for measuring, at a first frequency, a first magnitude of a received H field component of said lightning stroke;
      2. means for measuring, at a second frequency, a second magnitude of the received H field component of said lightning stroke; and
      3. means for determining the distance to said lightning stroke as a function of said first and second frequencies and ratio of said first magnitude to said second magnitude.

2. The apparatus in accordance with claim 1 wherein the functional relationship of the distance to said frequencies and magnitudes ratio comprises, $$\frac{c}{w_2} \sqrt{\frac{\left(\frac{a_1 w_1}{w_2}\right)^2 - H_0^2}{H_0^2 - (a_1)^2 \left(\frac{w_1}{w_2}\right)^4}}$$

wherein $H_o$ is the ratio of said first and second magnitudes, $w_1$ is the frequency of said first frequency measured in radians, $w_2$ is the frequency of the second frequency in radians, c is the constant of free space and R is the range to the lightning flash.

3. The apparatus in accordance with claim 2 wherein said first frequency is higher than said second frequency.

4. The apparatus in accordance with claim 2 wherein said first frequency is lower than said second frequency.

5. The apparatus in accordance with claim 4 wherein said first frequency is substantially equal to 1.5 KHz and said second frequency is substantially equal to 500 KHz.

6. A method for determining the location of lightning strokes, each lightning stroke generating electric (E) and magnetic (H) field components, said method comprising the steps of:

a. receiving separately the electric (E) and magnetic (H) field components of a lightning strike;
b. generating electrical signals associated with said E and H field components, said electrical signals being characterized by an initial rise time and a plurality of subsequent sub-pulse rise times;
c. determining the direction to said lightning stroke by operating upon said electrical signals associated with both said E and H field components; and
d. determining the distance to said lightning stroke by operating upon said electrical signals associated with said H field components said operation comprising the steps of:
  1. measuring, at a first frequency, a first magnitude of a received H field component of said lightning stroke;
  2. measuring, at a second frequency, a second magntidue of the received H field component of said lightning stroke; and
  3. determining the distance to said lightning stroke as a function of said first and second frequencies and the ratio of said first magnitude to said second magnitude.

7. The method in accordance with claim 6 wherein the functional relationshiip of the distance to said frequencies and the magnitudes ratio comprises, $$\frac{c}{w_2} \sqrt{\frac{\left(\frac{a_1 w_1}{w_2}\right)^2 - H_0^2}{H_0^2 - (a_1)^2 \left(\frac{w_1}{w_2}\right)^4}}$$

where $H_o$ is the ratio of said first and second magnitudes, $w_1$ is the frequency of said first frequency measured in radians, $w_2$ is the frequency of the second frequency in radians, c is the constant of free space and R is the range to the lightning flash.

8. The method in accordance with claim 7 wherein said first frequency is higher than said second frequency.

9. The method in accordance with claim 7 wherein said first frequency is lower than said second frequency.

10. The method in accordance with claim 9 wherein said first frequency is substantially equal to 1.5 KHz and said second frequency is substantially equal to 500 KHz.

* * * * *

UNITED STATES PATENT AND TRADEMARK OFFICE
CERTIFICATE OF CORRECTION

PATENT NO. : 4,672,305
DATED : June 9, 1987
INVENTOR(S) : Ernest W. Coleman

It is certified that error appears in the above-identified patent and that said Letters Patent is hereby corrected as shown below:

Column 3, line 22, the word "higgh" should read - -high- -.

Column 7, line 56, the word "linnes" should read - -lines- -.

Column 10, line 3, the word "contrrol" should read - -control- -, and the word "short" should read - -shot- -.

Column 11, line 31, "712a" should read - -612a- -.

Column 12, line 39, the word - -possible- - was omitted from between the words "each" and "combination".

Signed and Sealed this

Twenty-seventh Day of October, 1987

Attest:

DONALD J. QUIGG

Attesting Officer

Commissioner of Patents and Trademarks